United States Patent
Pruett et al.

(10) Patent No.: US 10,719,389 B2
(45) Date of Patent: Jul. 21, 2020

(54) ENHANCED DATA STORAGE WITH CONCATENATED INNER AND OUTER ERROR CORRECTION CODES

(71) Applicant: Burlywood, LLC, Longmont, CO (US)

(72) Inventors: David Christopher Pruett, Longmont, CO (US); Christopher Bergman, Erie, CO (US); Tod Roland Earhart, Longmont, CO (US)

(73) Assignee: Burlywood, Inc., Longmont, CO (US)

(*) Notice: Subject to any disclaimer, the term of this patent is extended or adjusted under 35 U.S.C. 154(b) by 27 days.

(21) Appl. No.: 16/204,022

(22) Filed: Nov. 29, 2018

(65) Prior Publication Data
US 2019/0171518 A1    Jun. 6, 2019

Related U.S. Application Data

(60) Provisional application No. 62/593,495, filed on Dec. 1, 2017.

(51) Int. Cl.
| | |
|---|---|
| G06F 11/00 | (2006.01) |
| H03M 13/03 | (2006.01) |
| G06F 11/10 | (2006.01) |
| H03M 13/29 | (2006.01) |
| H03M 13/37 | (2006.01) |
| H03M 13/11 | (2006.01) |

(Continued)

(52) U.S. Cl.
CPC ...... *G06F 11/1004* (2013.01); *G06F 11/1012* (2013.01); *H03M 13/1105* (2013.01); *H03M 13/29* (2013.01); *H03M 13/2906* (2013.01); *H03M 13/2948* (2013.01); *H03M 13/3746* (2013.01); *H03M 13/09* (2013.01); *H03M 13/1102* (2013.01); *H03M 13/152* (2013.01)

(58) Field of Classification Search
CPC ............ G06F 11/1004; G06F 11/1012; H03M 13/1105; H03M 13/29; H03M 13/2906; H03M 13/2948; H03M 13/3746; H03M 13/09; H03M 13/1102; H03M 13/152
See application file for complete search history.

(56) References Cited

U.S. PATENT DOCUMENTS

| | | | |
|---|---|---|---|
| 5,867,510 A * | 2/1999 | Steele | H03M 13/35 370/314 |
| 8,812,933 B2 * | 8/2014 | Joo | G06F 11/108 714/763 |

(Continued)

*Primary Examiner* — Christine T. Tu

(57) ABSTRACT

A method of operating a storage controller is provided. The method includes determining encoded data to be written to a storage media by applying at least an initial encoding comprising a first error correcting code type and a subsequent encoding comprising a second error correcting code type. The method further includes writing the encoded data to the storage media, and responsive to reading the encoded data from the storage media, processing the encoded data into primary decoded data using one or more primary decoders employing the second error correcting code type and detecting when data errors arise in the decoded data. The method also includes based at least on detecting one or more data errors in the decoded data, processing the encoded data into secondary decoded data using one or more secondary decoders employing the first error correcting code type.

20 Claims, 5 Drawing Sheets

(51) Int. Cl.
*H03M 13/15* (2006.01)
*H03M 13/09* (2006.01)

(56) References Cited

U.S. PATENT DOCUMENTS

2011/0075710 A1* 3/2011 Park .................. H04B 1/709
 375/146
2012/0144261 A1* 6/2012 Hong ................ G06F 11/1048
 714/755

* cited by examiner

ENHANCED DATA STORAGE WITH CONCATENATED INNER AND OUTER ERROR CORRECTION CODES

RELATED APPLICATIONS

This application hereby claims the benefit of and priority to U.S. Provisional Patent Application No. 62/593,495, titled "CONCATENATED BCH (INNER) LDPC (OUTER) CODE", filed on Dec. 1, 2017 and which is hereby incorporated by reference in its entirety.

TECHNICAL BACKGROUND

Data storage devices and other memories are commonly used in computers and as computer peripherals. All of these devices are prone to various data errors. Various methods are used to detect and correct data errors. Cyclic redundancy checks (CRC) may be used to detect errors, and various error correction codes may be used to correct errors. Single bit errors are relatively easy to detect and correct. Fortunately, single bit errors are more common than larger errors. However, larger errors do occur, and in order to detect and correct large errors, typical techniques consume memory, slow down the data storage device, and require additional circuitry within a media controller.

OVERVIEW

In an embodiment, a method of operating a media controller is provided. The method includes determining encoded data to be written to a storage media by applying at least an initial encoding comprising a first error correcting code type and a subsequent encoding comprising a second error correcting code type. The method further includes writing the encoded data to the storage media, and responsive to reading the encoded data from the storage media, processing the encoded data into primary decoded data using one or more primary decoders employing the second error correcting code type and detecting when data errors arise in the decoded data. The method also includes based at least on detecting one or more data errors in the decoded data, processing the encoded data into secondary decoded data using one or more secondary decoders employing the first error correcting code type.

In another embodiment, a media controller for a storage system is provided. The media controller includes a host interface, configured to interface with a host system, a storage interface, configured to interface with a storage media, and processing circuitry coupled with the host interface and the storage interface. The processing circuitry is configured to determine encoded data to be written to the storage media by applying at least an initial encoding comprising a first error correcting code type and a subsequent encoding comprising a second error correcting code type. The processing circuitry is further configured to write the encoded data to the storage media, and responsive to reading the encoded data from the storage media, process the encoded data into primary decoded data using one or more primary decoders employing the second error correcting code type and detecting when data errors arise in the decoded data. The processing circuitry is also configured to, based at least on detecting one or more data errors in the decoded data, process the encoded data into secondary decoded data using one or more secondary decoders employing the first error correcting code type.

In a further embodiment, one or more non-transitory computer-readable media having stored thereon program instructions to operate a media controller for a storage system are provided. The program instructions, when executed by processing circuitry, direct the processing circuitry to at least determine encoded data to be written to a storage media by applying at least an initial encoding comprising a first error correcting code type and a subsequent encoding comprising a second error correcting code type. The program instructions further direct the processing circuitry to at least write the encoded data to the storage media, and responsive to reading the encoded data from the storage media, process the encoded data into primary decoded data using one or more primary decoders employing the second error correcting code type and detecting when data errors arise in the decoded data. The program instructions also direct the processing circuitry to at least based at least on detecting one or more data errors in the decoded data, process the encoded data into secondary decoded data using one or more secondary decoders employing the first error correcting code type.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1A:
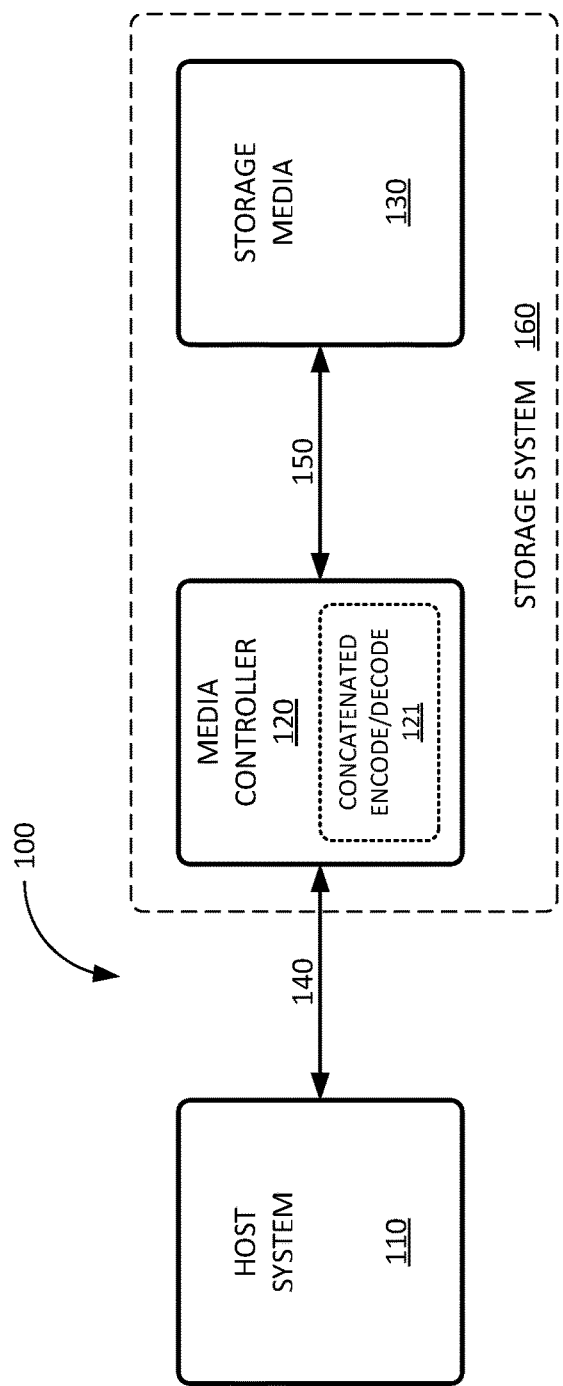
FIG. 1A illustrates an exemplary computer host and data storage system.

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

Discussed herein are systems and methods for employing concatenated error codes in data writes/reads to/from storage media. A concatenated error correcting code can be composed of two or more other error correcting code types. Encoding processes using a first (M) error correcting code type and second (N) error correcting code type can be represented as: $y=F_M(x)$ and $y=F_N(x)$. Decoding processes can be represented by the inverse: $F_M^{-1}$, $F_N^{-1}$. Encoding with a two-code concatenated code can be represented by: $y = F_M(F_N(x))$. Decoding with a two-code concatenated code can be represented by: $x=F_N^{-1}(F_M^{-1}(y))$.

In an example embodiment, a concatenated error correction code with an inner Bose-Chaudhuri-Hocquenghem (BCH) error correction code type and outer Low-Density Parity Check (LDPC) error correction code type is employed. In this example embodiment, data is decoded only with the LDPC when the BCH fails, utilizing the more effective LDPC soft-error correction capabilities while reducing the hardware requirements of the usual implementation of an outer BCH and inner LDPC.

LDPC codes have some advantages over BCH codes, but not without a cost in logic area and processing time. LDPC codes often outperform the error correction capability of BCH codes, for a given code rate. Unfortunately, LDPC decoders are often larger to implement than BCH decoders with similar bandwidth. LDPC implementations often offer improved capabilities when supplied with soft values representing the probability that a bit is a one or zero.

In current NAND flash interfaces, at least, producing the soft-values requires multiple reads of the same physical location, each with varied thresholds. The results of these individual reads are combined to produce a composite value that is the probability that the bit is a one or a zero. Sometimes these are represented as log-likelihood-ratios (LLRs). Producing soft-values is not always so painful. Other technologies (or even future NAND) provide them naturally. Producing soft-values is low cost in some channels, but others require additional, time-consuming operations and complexity.

Hard-values are produced by reading the physical location once and comparing the voltage read against a single threshold. If the voltage read is above the threshold, the data is a one, otherwise, the data is a zero. In one example embodiment, soft-values are produced by reading the physical location three times and comparing the voltages read against three different thresholds. These results are then combined to produce a number from −3 to +3, where −3 is very likely a zero, +3 is very likely to be a one, and 0 is equally likely to be a zero or one.

In some systems the power of an LDPC decoder may not be needed the vast majority of the operational time, not justifying the additional logic resources each LDPC decoder requires. In such systems, a BCH code may be adequate most of the time.

The enhanced systems and operations described herein include a concatenated code with an inner BCH code, capable of correcting the majority of errors, and an outer LDPC code to handle the remaining errors. BCH decoders are available in all of the nominal data paths for fast decoding most of the time, but with fewer gates/logic than LDPC decoders capable of the same bandwidth. A smaller number of LDPC decoders, perhaps only one, are employed when the BCH code fails. The initial attempt may use hard-decisions but subsequent retries may generate soft values to increase the correction power.

Figure 3:
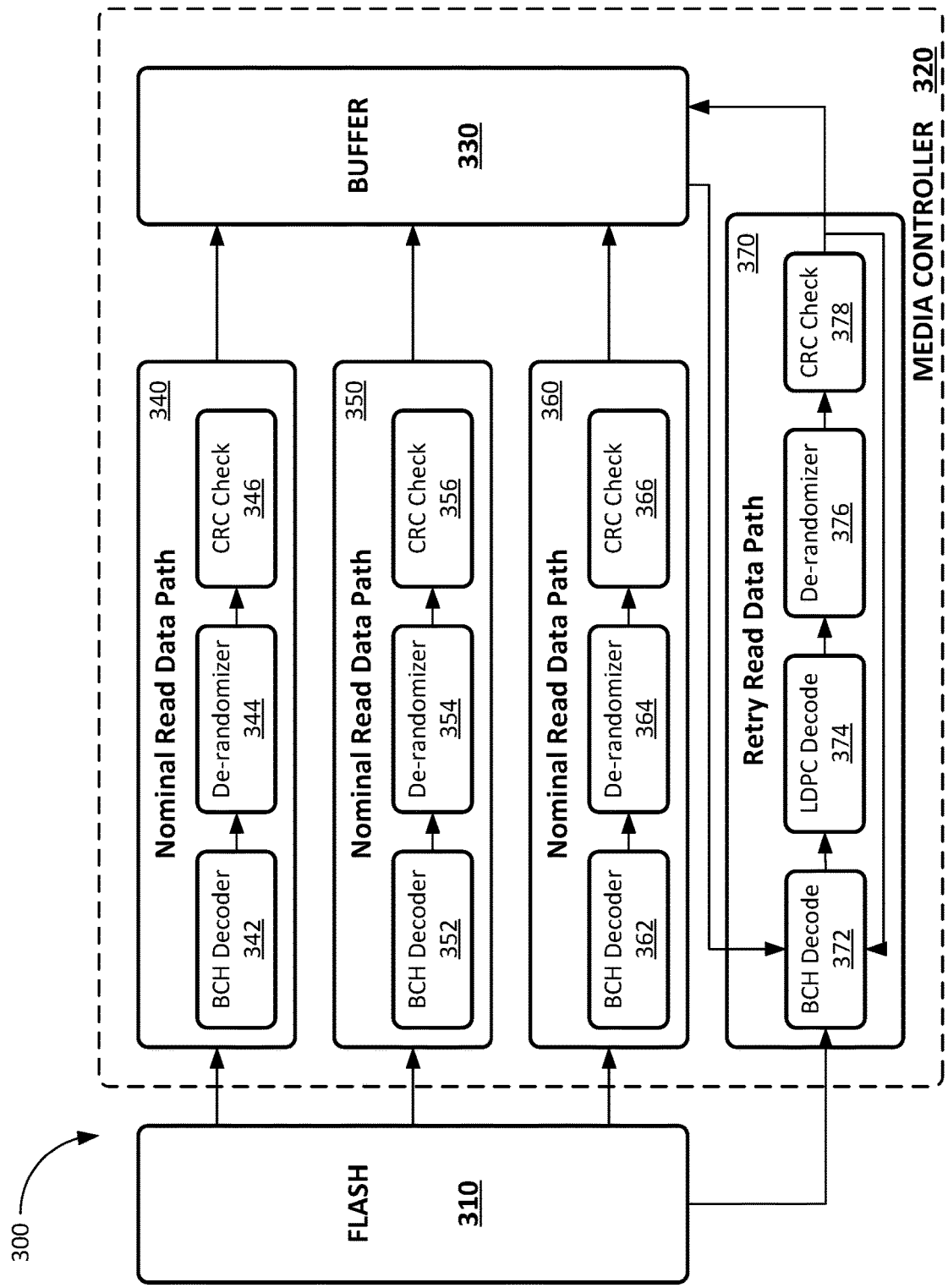
FIG. 3 illustrates an exemplary data storage system.

FIG. 3 (described in detail below) depicts read data paths of a system that utilizes the enhancements. The illustration does not depict the write data paths for clarity. However, write data paths typically consist of one or more such write data paths, each of which accepts data from a buffer, encodes it with an error detection code (CRC), randomizes the data in a reversible manner, encodes the data with an LDPC code, and then encodes it again with a BCH code, finally writing the data to a storage media, NAND flash in this example.

Randomization in this context is typically a reversible process that can be included in data writing processes. The randomization process is typically used in encoding processes to break up patterns that may be present in the underlying write data that corresponding data channels may not respond well to. These patterns can lead to data integrity issues on high-speed data channels. If employed during writes, the randomization process is reversed in a read decoder to recover the original pre-randomized data. While typically included in real data channels, randomization processes can be excluded in the examples herein with regard to the main error correction processes (BCH, LDPC, etc.).

The CRC (Cyclic Redundancy Check) process can be employed to detect errors using an error detection code. A write data encoder computes CRC bits(s) and combines the CRC bits(s) with the write data, and then applies the error correction codes (BCH/LDPC encoding) to produce encoded data. On reads, a decoder checks the CRC after the error correction codes have attempted to correct errors. If there were too many errors to be corrected, the CRC can detect remaining errors. Even if the CRC cannot correct errors, detection of the errors might still occur via the CRC. In the example embodiments herein, the CRC can be employed to detect when the BCH decoding has failed, which can trigger application of the LDPC decoder. Other forms of error detection algorithms can be employed than CRC.

In a formulaic notation, the encoding process (excluding randomization) might occur as follows. First a CRC is computed on data (x) using CRC function f(x). In some examples, an output of f(x) might produce one or more CRC bits which can be concatenated or combined with the data (x) to create CRC output data. This CRC output data is then used as an input to an encoder process using a first error correcting code type, such as BCH, represented by function 'g'. Thus g(f(x)) produces a primary encoded data as output. Then, the primary encoded data can be employed as an input to an encoder processes using a second error correcting code type, such as LDPC, represented by function 'h'. Thus h(g(f(x))) produces a secondary encoded data as output. This secondary encoded data can be written to the storage media for later retrieval.

For data reading, the system is equipped with one or more "nominal" read data paths and one or more "retry" read data paths. When reading, it first attempts to use a nominal read data path which decodes the BCH code, correcting as many errors as possible. The protection information for the LDPC code is discarded, without attempting to correct, as nominal read data paths lack LDPC decoders. Then the data is de-randomized and the CRC codes checked. If the CRC does not indicate errors, the data is transferred into the buffer successfully. For most reads, this is sufficient.

When a CRC check fails, a retry read data path is employed. This larger, slower block adds several distinct features, compared to a nominal read data path. Specifically, this retry read data path includes an LDPC decoder. Moreover, the retry ready data path may receive data from either the buffer or the storage media, and may decode iteratively. The retry read data path may accept hard-decision or soft-decision data directly from the storage media or it may fetch computed soft-decision data from the buffer.

In this example system there are three nominal read data paths and one retry read data path. Each nominal read data path is smaller, faster, and has lower latency than the retry read data path. An actual system will likely have a larger ratio of nominal to retry read data paths.

Alternative implementations can include:
  Using the more standard solution (inner LDPC, outer BCH, symmetric read data paths).
  Using an erasure correction code to recover from failures.
  Using another code that may perform better than BCH but cost less than LDPC decoder (Turbo, soft-value BCH, etc.).

Other systems include only BCH, only LDPC, or a concatenated code with an inner LDPC and outer BCH code. The LDPC provides most of the error correction capability with a high rate BCH code present to improve error floor. Typically, all read data paths in the system must implement decoders for all implemented codes. While powerful, this solution only rarely requires the full error correction capability.

The enhancements herein, while potentially lower in raw error correction capability or code rate, handle the vast majority of error cases with fewer logic resources.

FIG. 1a illustrates computer host and data storage system 100. In this example embodiment, host system 110 sends data to, and receives data from, media controller 120 for storage in storage system 130. In an example embodiment, storage system 130 comprises flash non-volatile memory, such as NAND memory. NAND memory is just one example, other embodiments of storage system 130 may comprise other types of storage. Media controller 120 communicates with storage system over link 150, and performs the function of configuring data received from host system 110 into a format that efficiently uses the memory resources of storage system 130.

Media controller 120 also provides translation between standard storage interfaces and command protocols used by host system 110 to a command protocol and the physical interface used by storage devices within storage system 130. Media controller 120 also implements concatenated error correction code (ECC) encode/decode functions as described above, along with data encoding, data recovery, retry recovery methods, and other processes and methods to optimize data integrity. In some examples, media controller 120 comprises concatenated encode/decode module 121 which is configured to perform the enhanced data encoding and decoding functions described herein.

Media controller 120 may take any of a variety of configurations. In some examples, media controller 120 may be a Field Programmable Gate Array (FPGA) with software, software with a memory buffer, an Application Specific Integrated Circuit (ASIC) designed to be included in a single module with storage system 130, a set of Hardware Description Language (HDL) commands, such as Verilog or System Verilog, used to create an ASIC, a separate module from storage system 130, built in to storage system 130, or any of many other possible configurations.

Host system 110 communicates with media controller 120 over various communication links, such as communication link 140. These communication links may use the Internet or other global communication networks. Each communication link may comprise one or more wireless links that can each further include Long Term Evolution (LTE), Global System For Mobile Communications (GSM), Code Division Multiple Access (CDMA), IEEE 802.11 WiFi, Bluetooth, Personal Area Networks (PANs), Wide Area Networks, (WANs), Local Area Networks (LANs), or Wireless Local Area Networks (WLANs), including combinations, variations, and improvements thereof. These communication links can carry any communication protocol suitable for wireless communications, such as Internet Protocol (IP) or Ethernet.

Additionally, communication links can include one or more wired portions which can comprise synchronous optical networking (SONET), hybrid fiber-coax (HFC), Time Division Multiplex (TDM), asynchronous transfer mode (ATM), circuit-switched, communication signaling, or some other communication signaling, including combinations, variations or improvements thereof. Communication links can each use metal, glass, optical, air, space, or some other material as the transport media. Communication links may each be a direct link, or may include intermediate networks, systems, or devices, and may include a logical network link transported over multiple physical links.

Media controller 120 communicates with storage system 130 over link 150. Link 150 may be any interface to a storage device or array. In one example, storage system 130 comprises NAND flash memory and link 150 may use the Open NAND Flash Interface (ONFI) command protocol, or the "Toggle" command protocol to communicate between media controller 120 and storage system 130. Other embodiments may use other types of memory and other command protocols. Other common low level storage interfaces include DRAM memory bus, SRAM memory bus, and SPI.

Link 150 can also be a higher level storage interface such as SAS, SATA, PCIe, Ethernet, Fiber Channel, Infiniband, and the like. However—in these cases, media controller 120 would reside in storage system 130 as it has its own controller.

Figure 1B:
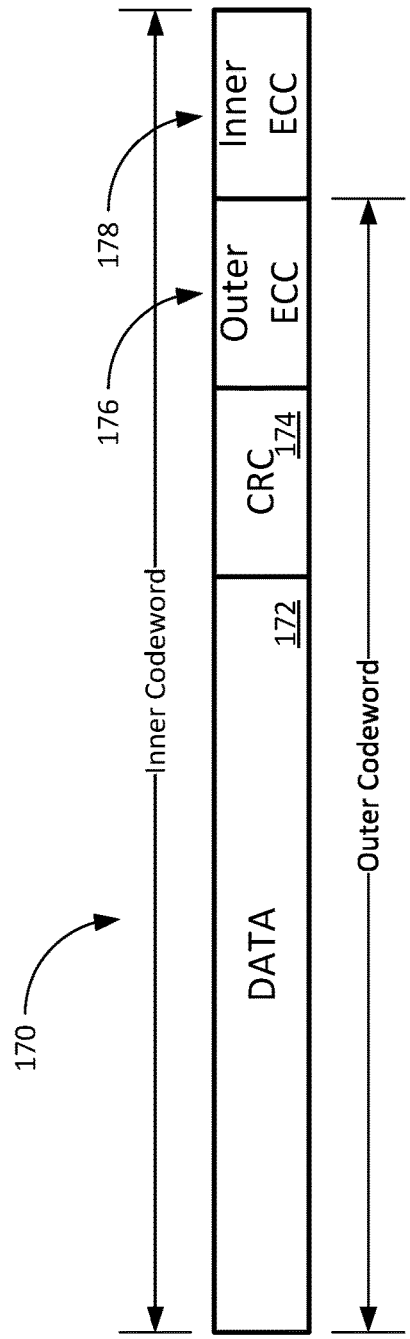
FIG. 1B illustrates an exemplary codeword data structure.

FIG. 1B illustrates an exemplary codeword 170 data structure. In this example embodiment, data 172 is concatenated with CRC data 174, Outer ECC data 176, and Inner ECC data 178. The outer codeword includes data 172, CRC data 174, and Outer ECC data 176. The inner codeword includes data 172, CRC data 174, Outer ECC data 176, and Inner ECC data 178. As discussed above, in most read operations the Inner ECC data 178 is not needed to correct any errors in the data, and the outer codeword is all that is needed, so the Inner ECC data 178 is never used.

Figure 2:
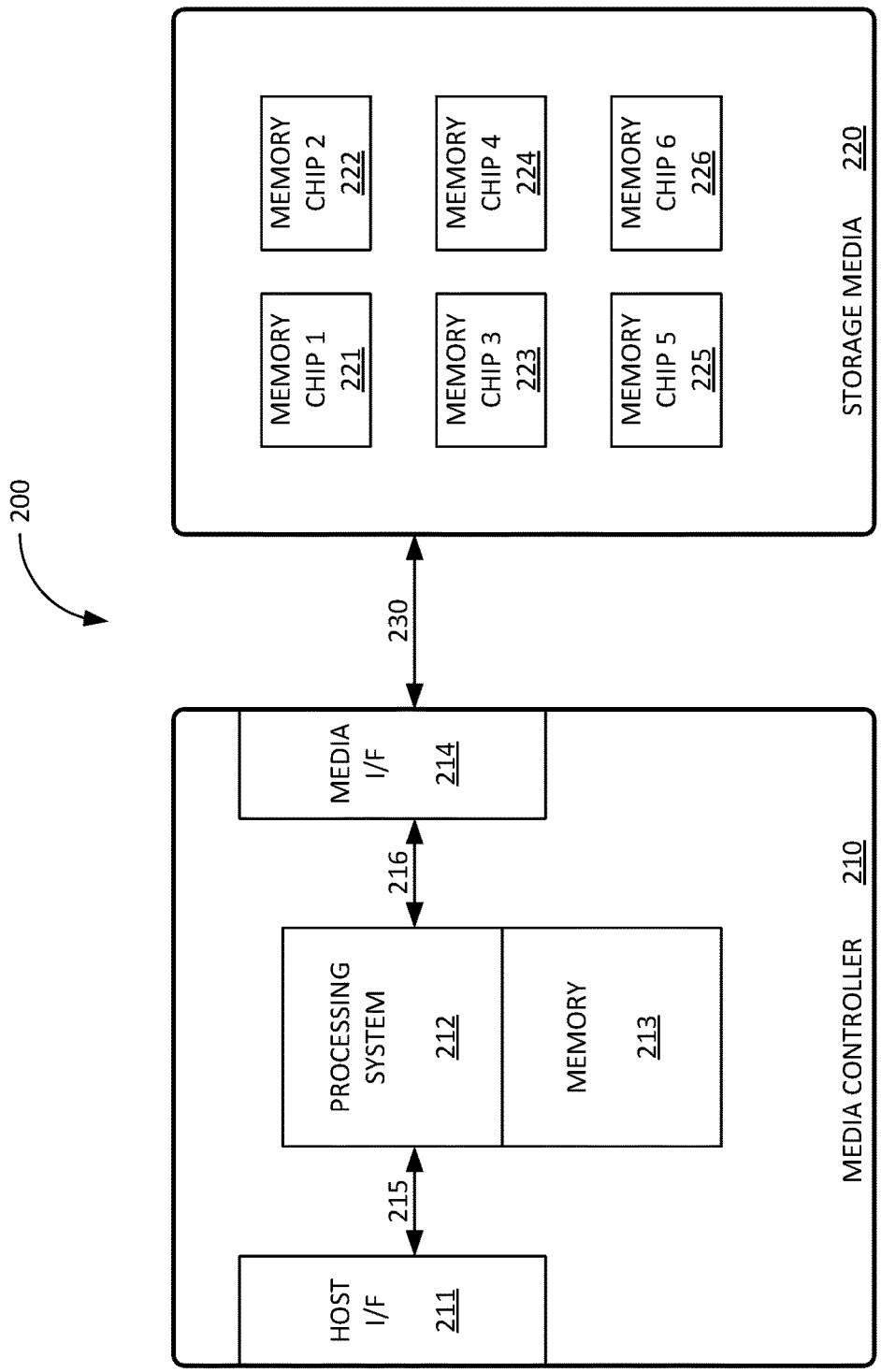
FIG. 2 illustrates an exemplary data storage system.

FIG. 2 illustrates an exemplary data storage system 200, such as storage system 160 from FIG. 1A, in more detail. This example system comprises media controller 210 and storage media 220. Storage media 220 comprises memory chips 1-6 (231-236). In an example embodiment, each memory chip 231-236 is a NAND memory integrated circuit. Other embodiments may use other types of memory.

Media controller 210 comprises a number of blocks or modules including host interface 211, processing system 212, memory 213, and media interface 214. Processing system 212 communicates with the interfaces over links 215 and 216. Media interface 214 communicates with storage media 220 over link 230.

In this example, processing system 212 receives host data from a host through host interface 211 over link 215. Processing system 212 performs concatenated error correction code (ECC) encode functions as described above, and configures the data as needed for storage in storage media 220 and transfers the data to media interface 214 for transfer to storage media 220 over link 230.

When reading data from storage media 220, processing system receives data through media interface 214, performs concatenated error correction code (ECC) decode functions as described above, configures the data for transfer to the host system, and transfers the data to host interface 211 for transfer to the host system.

FIG. 3 depicts read data paths of a system that utilizes the enhancements. The illustration does not depict the write data paths for clarity. However, write data paths typically consist of one or more such write data paths, each of which accepts data from a buffer, encodes it with an error detection code (CRC), randomizes the data in a reversible manner, encodes the data with an LDPC code, and then encodes it again with a BCH code, finally writing the data to a storage media, NAND flash in this example.

In this example embodiment, media controller 320 includes three nominal read data paths 340, 350, and 360, along with one retry read data path 370. Other embodiments may use different quantities and ratios of nominal and retry read data paths within the scope of the present invention.

In this example, nominal read data path 340 includes BCH decoder 342, de-randomizer 344, and CRC check 346, nominal read data path 350 includes BCH decoder 352, de-randomizer 354, and CRC check 356, and nominal read data path 360 includes BCH decoder 362, de-randomizer 364, and CRC check 366. Retry read data path 370 includes BCH decoder 372, LDPC decoder 374, de-randomizer 376 and CRC check 378.

Media controller 320 also includes buffer 330 in memory. In an example embodiment, flash memory 310 supplies data to nominal read data paths 340, 350, and 360, and optionally to retry read data path 370. Each nominal read data path decodes the BCH code, correcting as many errors as possible. The protection information for the LDPC code is discarded, without attempting to correct, as nominal read data paths lack LDPC decoders. Then the data is de-randomized and the CRC codes checked. If the CRC does not indicate errors, the data is transferred into buffer 330 successfully. For most reads, this is sufficient.

When a CRC check fails, retry read data path 370 is employed. Retry read data path 370 may read data from buffer 330 or flash 310. The data in buffer 330 may be the result of a process to extract and/or compute soft-values from flash 310. Retry read data path 370 decodes the BCH code 372, correcting as many errors as possible, then decodes the LDPC code 374 in an attempt to correct the remaining errors. The data is then de-randomized 376 and the CRC codes are checked 378. If the CRC does not indicate errors, the data is transferred into buffer 330 successfully. If the CRC 378 still indicates errors, the retry read process may be performed iteratively by transferring the data back to BCH decoder 372 and beginning the process again.

Figure 4:
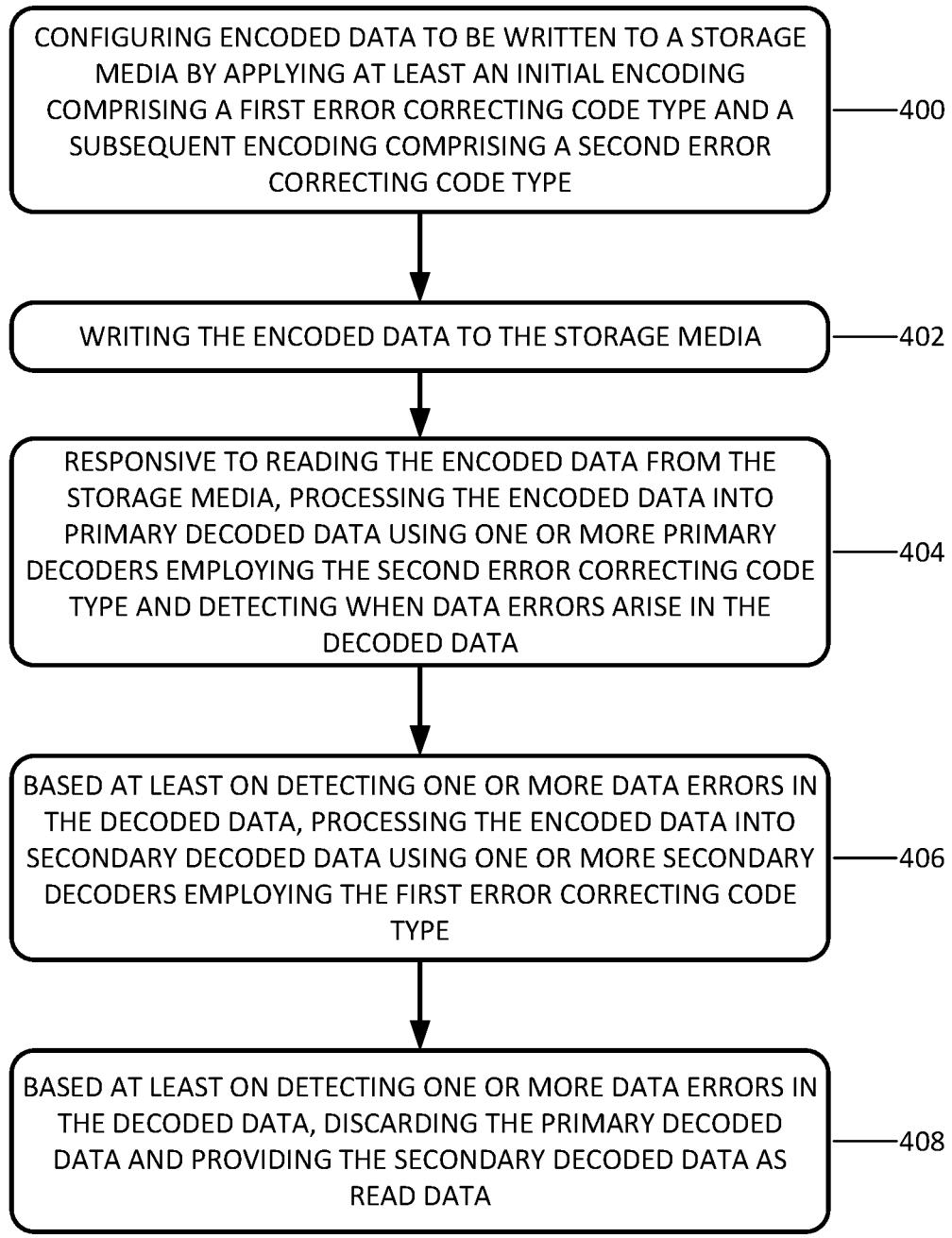
FIG. 4 illustrates an exemplary method for operating a media controller.

FIG. 4 illustrates an exemplary method for operating a media controller, such as media controller 120 from FIG. 1A. In this example embodiment, media controller 320 configures encoded data to be written to a storage media by applying at least an initial encoding comprising a first error correcting code type (for example LDPC) and a subsequent encoding comprising a second error correcting code type (for example BCH), (operation 400).

Media controller 120 writes the encoded data to storage media 130, (operation 402). Responsive to reading the encoded data from the storage media 130, media controller 120 processes the encoded data into primary decoded data using one or more primary decoders (such as nominal read data paths 340, 350, and 360 from FIG. 3) employing the second error correcting code type (for example BCH) and detecting when data errors arise in the decoded data (for example using a CRC), (operation 404).

Based at least on detecting one or more data errors in the decoded data, media controller 120 processes the encoded data into secondary decoded data using one or more secondary decoders (such as retry read data path 370 from FIG. 3) employing the first error correcting code type (for example LDPC), (operation 406).

Optionally, based at least on detecting one or more data errors in the decoded data, media controller 120 discards the primary decoded data and providing the secondary decoded data as read data, (operation 408).

Figure 5:
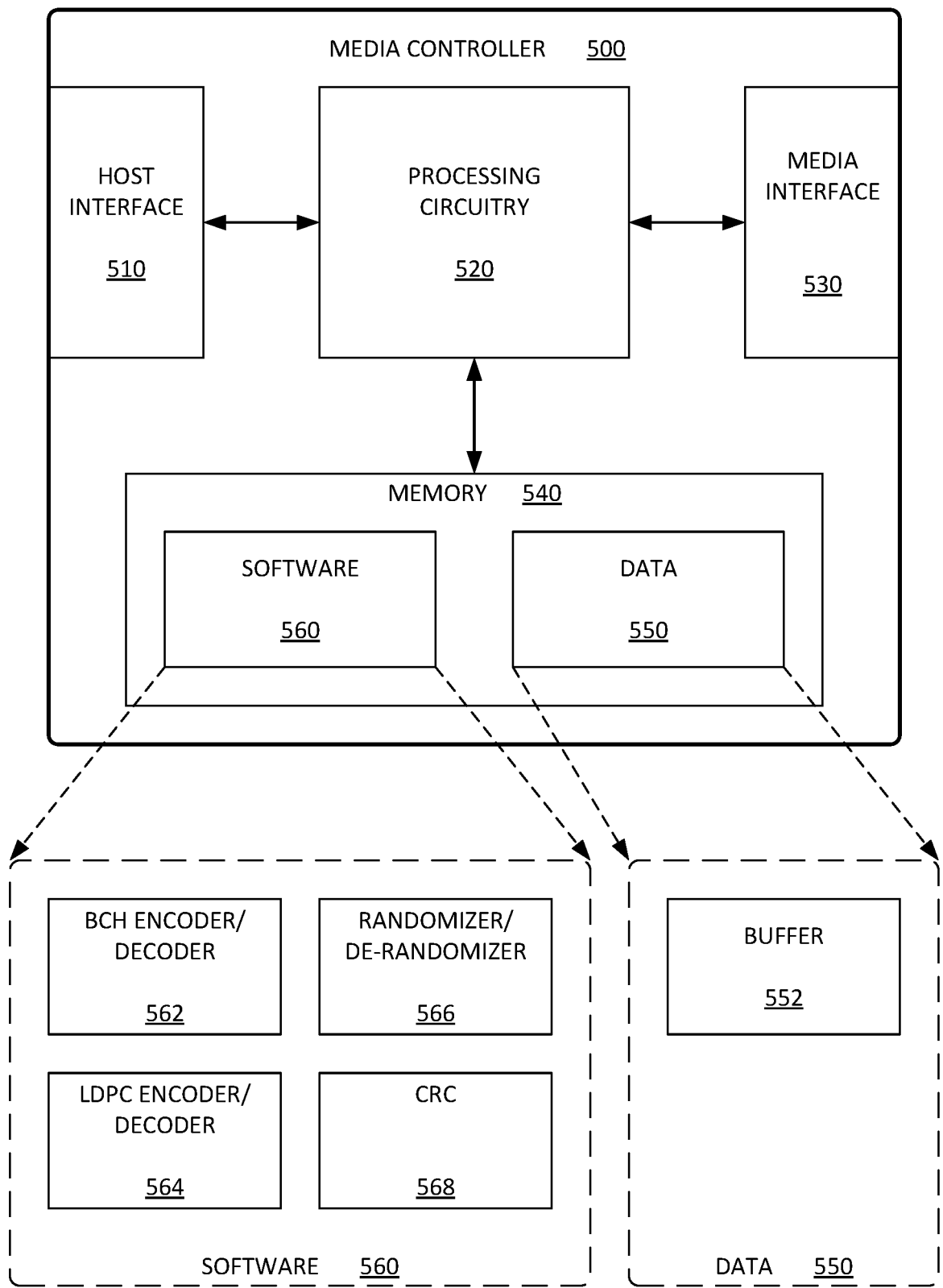
FIG. 5 illustrates an exemplary media controller.

FIG. 5 illustrates media controller 500. As discussed above, media controller 500 may take on any of a wide variety of configurations. Here, an example configuration is provided for a storage controller implemented as an ASIC. However, in other examples, media controller 500 may be built into a storage system or storage array, or into a host system.

In this example embodiment, media controller 500 comprises host interface 510, processing circuitry 520, media interface 530, and memory 540. Host interface 510 comprises circuitry configured to receive data and commands from an external host system and to send data to the host system.

Media interface 530 comprises circuitry configured to send data and commands to an external storage media and to receive data from the storage media.

Processing circuitry 520 comprises electronic circuitry configured to perform the tasks of a media controller configured to perform concatenated error correction code (ECC) encode/decode functions as described above. Processing circuitry 520 may comprise microprocessors and other circuitry that retrieves and executes software 560. Processing circuitry 520 may be embedded in a storage system in some embodiments. Examples of processing circuitry 520 include general purpose central processing units, application specific processors, and logic devices, as well as any other type of processing device, combinations, or variations thereof. Processing circuitry 520 can be implemented within a single processing device but can also be distributed across multiple processing devices or sub-systems that cooperate in executing program instructions.

Memory 540 can comprise any non-transitory computer readable storage media capable of storing software 560 that is executable by processing circuitry 520. Memory 520 can also include various data structures 550 which comprise one or more buffers, databases, tables, lists, or other data structures. In an example embodiment, data 550 includes buffer 552, such as buffer 330 from FIG. 3. Memory 540 can include volatile and nonvolatile, removable and non-removable media implemented in any method or technology for storage of information, such as computer readable instructions, data structures, program modules, or other data.

Memory 540 can be implemented as a single storage device but can also be implemented across multiple storage devices or sub-systems co-located or distributed relative to each other. Memory 540 can comprise additional elements, such as a controller, capable of communicating with processing circuitry 520. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which can be used to store the desired information and that can be accessed by an instruction execution system, as well as any combination or variation thereof.

Software 560 can be implemented in program instructions and among other functions can, when executed by media controller 500 in general or processing circuitry 520 in particular, direct media controller 500, or processing circuitry 520, to operate as described herein for a media controller. Software 560 can include additional processes, programs, or components, such as operating system software, database software, or application software. Software 560 can also comprise firmware or some other form of machine-readable processing instructions executable by elements of processing circuitry 520.

In at least one implementation, the program instructions can include BCH encoding/decoding module 562, LDPC encoding/decoding module 564, randomizer/de-randomizer module 566, and CRC module 568.

BCH encoding/decoding module 562 includes instructions directing processing circuitry 520 to encode and/or decode data using BCH error correction codes. LDPC encoding/decoding module 564 includes instructions directing processing circuitry 520 to encode and/or decode data using LDPC error correction codes. Randomizer/de-randomizer module 566 includes instructions directing processing circuitry 520 to randomize and/or de-randomize data as described above. CRC module 568 includes instructions directing processing circuitry 520 to perform cyclic redundancy checks on data as described above.

In general, software 560 can, when loaded into processing circuitry 520 and executed, transform processing circuitry 520 overall from a general-purpose computing system into a special-purpose computing system customized to operate as described herein for a storage controller, among other operations. Encoding software 560 on memory 540 can transform the physical structure of memory 540. The specific transformation of the physical structure can depend on various factors in different implementations of this description. Examples of such factors can include, but are not limited to the technology used to implement the storage media of memory 540 and whether the computer-storage media are characterized as primary or secondary storage.

For example, if the computer-storage media are implemented as semiconductor-based memory, software 560 can transform the physical state of the semiconductor memory when the program is encoded therein. For example, software 560 can transform the state of transistors, capacitors, or other discrete circuit elements constituting the semiconductor memory. A similar transformation can occur with respect to magnetic or optical media. Other transformations of physical media are possible without departing from the scope of the present description, with the foregoing examples provided only to facilitate this discussion.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

What is claimed is:

1. A method of operating a data storage device, the method comprising:
   determining encoded data to be written to a storage media by applying to source data at least an initial encoding comprising a first error correcting code type and a subsequent encoding comprising a second error correcting code type;
   writing the encoded data to the storage media;
   responsive to reading the encoded data from the storage media, processing the encoded data into primary decoded data using one or more primary decoders employing the second error correcting code type and detecting data errors arising in the decoded data; and
   based at least on detecting one or more data errors in the decoded data, processing the encoded data into secondary decoded data using one or more secondary decoders employing the first error correcting code type.

2. The method of claim 1, further comprising:
   based at least on detecting one or more data errors in the decoded data, discarding the primary decoded data and providing the secondary decoded data as read data.

3. The method of claim 1, wherein the first error correcting code type is a Low-Density Parity Check (LDPC) error correcting code, and the second error correcting code type is a Bose-Chaudhuri-Hocquenghem (BCH) error correction code.

4. The method of claim 1, wherein configuring encoded data further comprises encoding with an error detection code, and randomizing in a reversible manner.

5. The method of claim 4, wherein the error detection code uses at least a Cyclic Redundancy Check (CRC).

6. The method of claim 1, wherein processing the encoded data into secondary decoded data using one or more secondary decoders employing the first error correcting code type is performed iteratively until no data errors are detected in the decoded data.

7. The method of claim 1, wherein the primary decoders each comprises a BCH decoder module, a de-randomizer module, and a CRC check module; and wherein the secondary decoders each comprises a BCH decoder module, a LDPC decoder module, a de-randomizer module, and a CRC check module.

8. A media controller for a storage system comprising:
   a host interface, configured to interface with a host system;
   a media interface, configured to interface with a storage media; and
   processing circuitry coupled with the host interface and the storage interface configured to:
      determine encoded data to be written to the storage media by applying at least an initial encoding comprising a first error correcting code type and a subsequent encoding comprising a second error correcting code type;
      write the encoded data to the storage media;
      responsive to reading the encoded data from the storage media, process the encoded data into primary decoded data using one or more primary decoders employing the second error correcting code type and detecting when data errors arising in the decoded data; and
      based at least on detecting one or more data errors in the decoded data, process the encoded data into secondary decoded data using one or more secondary decoders employing the first error correcting code type.

9. The media controller of claim 8, wherein the processing circuitry is further configured to:
   based at least on detecting one or more data errors in the decoded data, discard the primary decoded data and providing the secondary decoded data as read data.

10. The media controller of claim 8, wherein the first error correcting code type is a Low-Density Parity Check (LDPC) error correcting code, and the second error correcting code type is a Bose-Chaudhuri-Hocquenghem (BCH) error correction code.

11. The media controller of claim 8, wherein configuring encoded data further comprises encoding with an error detection code, and randomizing in a reversible manner.

12. The media controller of claim 11, wherein the error detection code uses at least a Cyclic Redundancy Check (CRC).

13. The media controller of claim 8, wherein processing the encoded data into secondary decoded data using one or more secondary decoders employing the first error correcting code type is performed iteratively until no data errors are detected in the decoded data.

14. The media controller of claim 8, wherein the primary decoders each comprises a BCH decoder module, a de-randomizer module, and a CRC check module; and wherein the secondary decoders each comprises a BCH decoder module, a LDPC decoder module, a de-randomizer module, and a CRC check module.

15. One or more non-transitory computer-readable media having stored thereon program instructions to operate a media controller for a storage system, the program instructions, when executed by processing circuitry, direct the processing circuitry to at least:
  determine encoded data to be written to a storage media by applying at least an initial encoding comprising a first error correcting code type and a subsequent encoding comprising a second error correcting code type;
  write the encoded data to the storage media;
  responsive to reading the encoded data from the storage media, process the encoded data into primary decoded data using one or more primary decoders employing the second error correcting code type and detecting data errors arising in the decoded data; and
  based at least on detecting one or more data errors in the decoded data, process the encoded data into secondary decoded data using one or more secondary decoders employing the first error correcting code type.

16. The one or more non-transitory computer-readable media of claim 15, wherein the program instructions further direct the processing circuitry to at least:
  based at least on detecting one or more data errors in the decoded data, discard the primary decoded data and providing the secondary decoded data as read data.

17. The one or more non-transitory computer-readable media of claim 15, wherein the first error correcting code type is a Low-Density Parity Check (LDPC) error correcting code, and the second error correcting code type is a Bose-Chaudhuri-Hocquenghem (BCH) error correction code.

18. The one or more non-transitory computer-readable media of claim 15, wherein configuring encoded data further comprises encoding with an error detection code, and randomizing in a reversible manner.

19. The one or more non-transitory computer-readable media of claim 18, wherein the error detection code uses at least a Cyclic Redundancy Check (CRC).

20. The one or more non-transitory computer-readable media of claim 15, wherein processing the encoded data into secondary decoded data using one or more secondary decoders employing the first error correcting code type is performed iteratively until no data errors are detected in the decoded data.

* * * * *

UNITED STATES PATENT AND TRADEMARK OFFICE
CERTIFICATE OF CORRECTION

PATENT NO. : 10,719,389 B2  
APPLICATION NO. : 16/204022  
DATED : July 21, 2020  
INVENTOR(S) : David Christopher Pruett et al.

Page 1 of 1

It is certified that error appears in the above-identified patent and that said Letters Patent is hereby corrected as shown below:

In the Claims

Column 10, Claim 8, Line 43, delete "when"

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*